United States Patent [19]

French et al.

[11] 4,125,329
[45] Nov. 14, 1978

[54] TRISTIMULUS COLORIMETER

[75] Inventors: Park French, Aurora; William H. Conaway, Paris, both of Ohio

[73] Assignee: Sterndent Corporation, Mount Vernon, N.Y.

[21] Appl. No.: 721,108

[22] Filed: Sep. 7, 1976

[51] Int. Cl.² ............................ G01J 3/46; G01J 3/48
[52] U.S. Cl. .................................... 356/405; 356/408; 356/418
[58] Field of Search ................. 356/176, 179, 188, 195

[56] References Cited

U.S. PATENT DOCUMENTS

| | | | |
|---|---|---|---|
| 2,774,276 | 12/1956 | Glasser et al. | 356/176 |
| 3,528,749 | 9/1970 | Bowker | 356/223 X |
| 3,684,378 | 8/1972 | Lord | 356/179 X |
| 3,690,772 | 9/1972 | Enol | 356/179 |
| 3,973,849 | 8/1976 | Jackson et al. | 356/95 X |
| 3,986,777 | 10/1976 | Roll | 356/176 |

*Primary Examiner*—F. L. Evans
*Assistant Examiner*—Rodney B. Bovernick
*Attorney, Agent, or Firm*—Maky, Renner, Otto & Boisselle

[57] ABSTRACT

A tristimulus colorimeter employs a multiplexed dual slope integrator digital voltmeter wherein unknown and reference light beams are compared by sequentially applying unknown and reference electrical signals representative of the two respective light beams to the non-inverting and inverting inputs, respectively, of the integrator amplifier. Moreover, a compensating circuit provides for compensation of the colorimeter output signals with respect to reflectance error encountered in the optics portion of the colorimeter.

38 Claims, 5 Drawing Figures

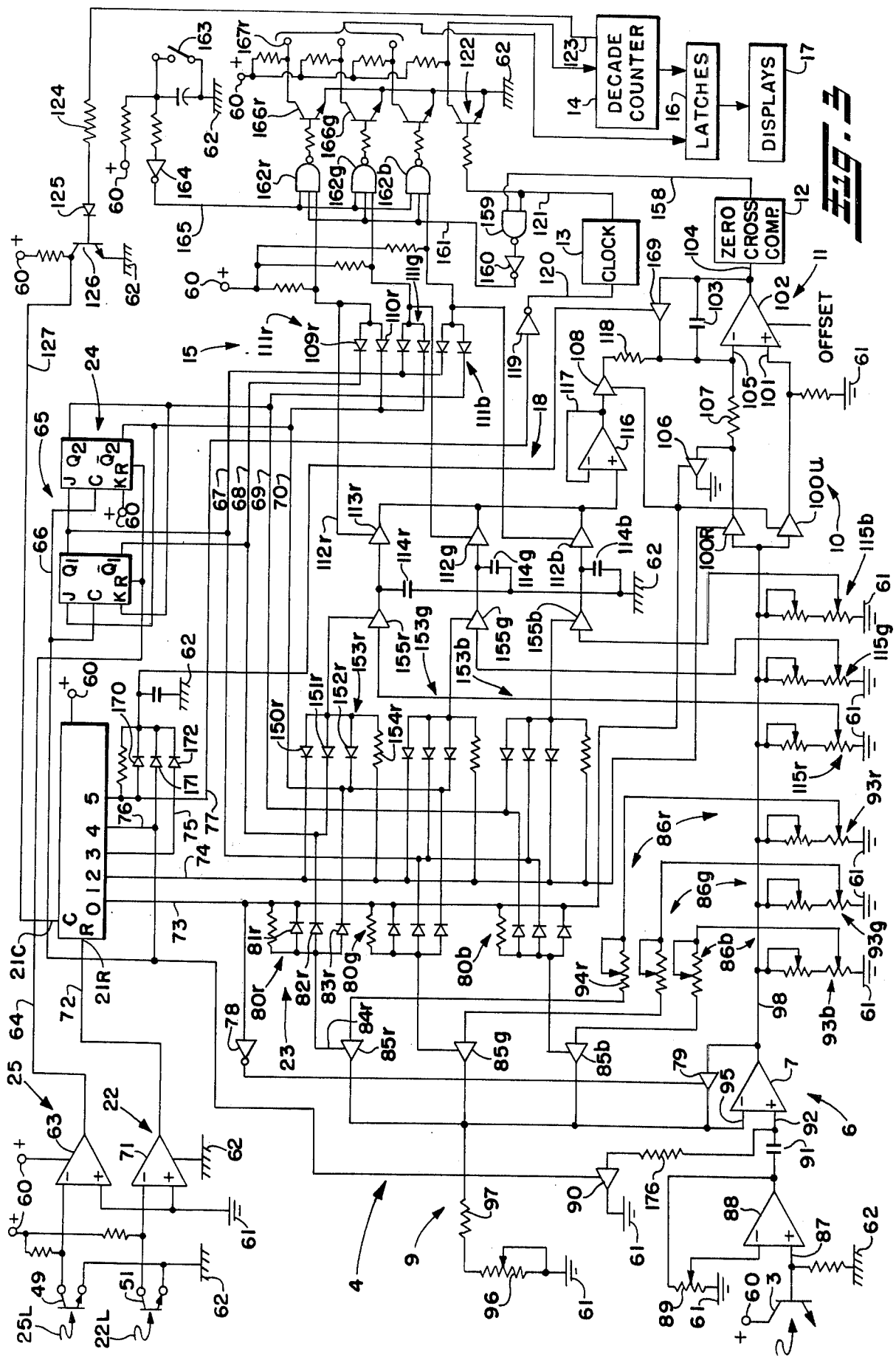

TRISTIMULUS COLORIMETER

BACKGROUND OF THE INVENTION

The present invention relates generally to a tristimulus colorimeter and, more particularly, to such a colorimeter that is adapted for measuring the color of teeth. Moreover, the invention relates to improvements in such a colorimeter with these improvements also being useful in other types of systems, such as, for example, those having optical or non-optical transducers for detecting particular phenomena and measuring circuitry that measures the electrical output of the transducer to provide a visual display and/or a control function.

Although the invention will be described with reference particularly to a reflection type tristimulus colorimeter that produces a digital display indicative of the red, green and blue color components of a tooth, it will be appreciated that the various features of the invention may be employed with other types of color or non-color reflection or transmission types of optical measuring systems, non-optical transducer input measuring systems, and the like.

Related U.S. patent applications which include subject matter pertinent to the invention of this application and are commonly assigned are as follows: Ser. No. 499,479, filed Aug. 22, 1974, now U.S. Pat. No. 3,986,777; Ser. No. 696,787, filed June 16, 1976, now U.S. Pat. No. 4,055,813; Ser. No. 698,143, filed June 21, 1976, now U.S. Pat. No. 4,080,074; and Ser. No. 721,107 filed concurrently herewith for "Comparison Type Colorimeter."

In the first application a colorimeter is disclosed employing a multiplexed dual slope integrator type of digital voltmeter to provide a digital display of red, green and blue components of light reflected from an object. In the dual slope integrator a first electrical signal derived from a photosensor is compared with a reference electrical signal from an electric energy source, and the visual display of digital color values is related to the results of that comparison. A color filter wheel cyclically sequentially interposes red, green and blue filters in the unknown light beam reflected by the object to the photosensor, and the multiplexing circuitry is synchronized to the wheel and is reset on each complete cycle. The synchronized multiplexing circuit then automatically controls operation of the dual slope integrator to place respective calibrating circuits therein and to deliver electrical output signals therefrom to respective red, blue and green visual displays.

In the second and third applications there are respectively disclosed a "Single Adjustment Multiple Function Calibration Circuit" to facilitate compensation for drift in a multiplexed amplifier having plural feedback channels selectively coupled thereto and an "Automatic Zeroing Circuit To Compensate For Dark Currents or the Like" to eliminate inaccuracies in measurements due to commonly experienced dark current or other leakage current in the transducer.

In the last application an arrangement of the optical elements, including light pipes and color filters for illuminating an object and for sequentially directing unknown beams of colored light reflected from the object and reference beams of corresponding colors to a common photosensor, is disclosed. This as well as other optical measuring and testing devices may experience optical error, whereby a known portion of incident, reflected or other light passing through one or more optical elements of the system is diverted, for example, by reflection from one to another of plural light paths or is simply attenuated by the optical elements. Since such optical error is usually due to internal reflection, for example, within a bifurcated light pipe or other optical elements through which two or more light beams simultaneously pass, such optical error will be referred to hereinafter as reflectance error; however, it will be understood that reflectance error also means other types of optical error as well.

SUMMARY OF THE INVENTION

In the present invention an improved tristimulus colorimeter employs a dual slope integrator type digital voltmeter that compares unknown and reference light beams and produces a digital output indicative of such comparison. In one embodiment a single light source, which includes an enclosure about a lamp to shield the same from dust and, thus, to enhance the stabilization of the light output therefrom, directs light via respective light pipes to illuminate an object to be optically measured or examined and to provide a reference light beam. Light from the object in an unknown light beam and the reference light beam are intermittently or sequentially directed onto a photosensor. Further, color filters of the colorimeter are mounted in a movable support, such as a color filter wheel, that sequentially and cyclically moves one color filter in the path of the unknown light beam and subsequently moves the same color filter to position in the light path of the reference light beam, thereby to assure that the color filtering effected of each light beam is the same. Measurement of each color of the unknown light beam relative to each corresponding color of the reference light beam is then effected by a measuring circuit, whereby in a preferred embodiment the color values ultimately evolved and preferably displayed represent respective ratios of each color component of the unknown light beam to each corresponding color component of the reference light beam. Therefore, importantly, the colorimeter is substantially independent of the absolute intensity of the light source, which with aging may produce a light output of reduced absolute intensity but of substantially constant color temperature or spectral distribution. Similarly, the color and/or transmission characteristics of the several color filters may change with aging of the filters; however, the invention preferably assures that the unknown and reference light beams both pass through each color filter so that the mentioned ratios will remain substantially constant.

An unknown electrical signal produced by one color component of an unknown light beam impinging on a photosensor is normalized by calibration circuitry or the like and then is integrated for a predetermined duration. Subsequently, a reference electrical signal produced by the photosensor when the same color component of a reference light beam impinges thereon is integrated in the relatively opposite polarity direction, and at some time during the latter integration the electrical output of the integrator passes a predetermined signal level detected by a comparator that triggers the displaying of a digital value indicative of the elapsed time of the latter integration. The displayed value is representative of the intensity of that color component of the unknown light beam, and similar measurements are made to obtain displays of other color components.

In one form of the invention a common circuit is employed in the measuring circuitry whereby the unknown electrical signal is directed to a non-inverting input of the integrator and the reference electrical signal is directed to an inverting input by such common circuit which eliminates the need for additional inverting or like circuitry. Therefore, except for switching those unknown and reference electrical signals to the respective inputs, those signals are substantially developed in common channels; accordingly offset drift and similar discrepancies between the inverted and non-inverted circuit channels of prior art devices are appreciably reduced and/or eliminated.

Moreover, a compensating circuit arrangement is provided for cancelling the effect of reflectance error or the like which ordinarily is a relatively fixed percentage of the light input to the optical portion of the colorimeter and thus of the reference light beam substantially directly from the light source. The reflectance cancellation circuit stores a compensating electrical signal as a percentage of the reference electrical signal for each color and under control of a multiplexing circuit delivers respective compensating electrical signals for simultaneous, relatively opposite polarity direction integration with the unknown electrical signal.

The multiplexing circuit is synchronized with a color filter wheel, which cyclically sequentially filters the respective color components of the unknown and reference light beams, initially at the start of the first complete cycle thereof and subsequently at the commencement of measurement of each respective color light of the unknown light beam. The multiplexing circuit also includes an internal synchronizing mechanism associated directly with a clock oscillator and output counter, which delivers the digital output signals to the display, both to control the respective operations of the dual slope integrator and to assure that all amplifier circuits in the colorimeter are always maintained under controlled gain conditions. This feature prevents the connection of an amplifier in an infinite gain condition, for example, which may cause saturation and subsequent slow recovery of the amplifier and/or related circuitry and thereby maintains the circuitry of the colorimeter in condition for prompt operation as each color light is measured.

With the foregoing in mind, a principal object of the invention is to provide a tristimulus colorimeter that is improved in the noted respects.

Another object is to improve the accuracy of measurements made in optical measuring systems, such as tristimulus colorimeters, and non-optical measuring systems.

An additional object is to improve the accuracy of comparisons made in a dual slope integrator.

A further object is to compensate for reflectance and/or other optical error in an optical measuring system and, moreover, to provide similar compensation for relatively fixed percentage errors in other types of detecting and measuring systems.

Still another object is to assure that in a multiplexed circuit system controlled gains are provided respective amplifiers and the like therein.

Still a further object is to facilitate correction of drift and similar calibration of multiplexed circuit systems.

Even another object of the invention is to facilitate the measuring of color of an object, such as a tooth or the like, and conveniently to present the measured color values.

Even an additional object is to maintain the accuracy of measurements made by a colorimeter although the light source thereof may age and reduce its light intensity output.

These and other objects and advantages of the present invention will become more apparent as the following description proceeds.

To the accomplishment of the foregoing and related ends, the invention, then, comprises the features hereinafter fully described in the specification and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 3 is a schematic diagram, partly in block form, of the circuitry of the colorimeter;

DESCRIPTION OF THE PREFERRED EMBODIMENT

Figure 1:
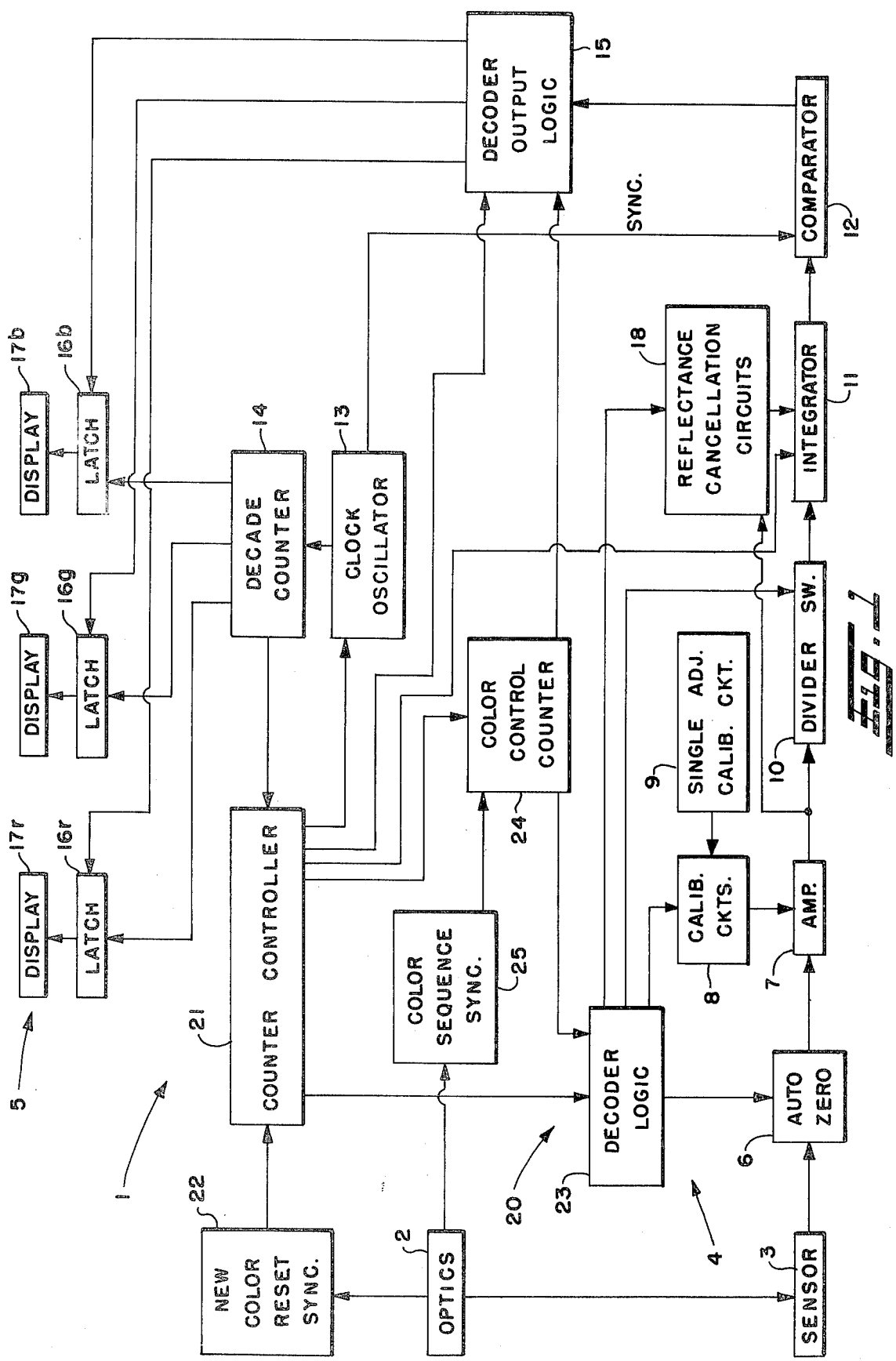
FIG. 1 is a block diagram of an improved tristimulus colorimeter in accordance with the invention.

Referring now more particularly to the drawings, wherein like reference numerals designate like parts in the several figures, and initially to FIG. 1, a comparison type of tristimulus colorimeter in accordance with the invention is generally indicated at 1. The colorimeter 1 includes an optics portion 2 that directs unknown and reference light beams, which are cyclically sequentially filtered to their red, green and blue color components, to a photosensitive transducer or sensor 3, which produces unknown and reference electrical signals, respectively, indicative of the intensity of the light of each color light impinging thereon. These electrical signals are measured in a measuring circuit 4, which produces electrical output signals for display as respective red, green and blue color values in digital form at an output display 5.

The measuring circuit 4 is multiplexed to obtain efficient use of numerous portions thereof and for accuracy whereby electrical signals developed as the red, green and blue components of the unknown and reference lights are measured pass along substantially the same circuit channels. Moreover, the multiplexed measuring circuit includes a modified dual slope integrator type of digital voltmeter that compares the unknown electrical signal for each color with the corresponding reference electrical signal for each color and produces respective electrical output signals indicative of those comparisons and, therefore, of the intensities of the color components of the unknown light beam relative to the color components of the reference light beam. The electrical output signals produced by the dual slope integrator digital voltmeter preferably are displayed in the output display 5, as mentioned, or may be alternatively directed to other circuits to provide process control functions or the like related to the measured colors.

In the measuring circuit 4 an automatic zeroing circuit 6, which is described in greater detail in the copending U.S. patent application Ser. No. 698,143, zeroes the electrical output from the sensor 3 to eliminate the effect of dark currents and the like therein and then provides the respective unknown and reference electrical signals through to an amplifier 7. A calibration circuit portion 8 and a single adjustment calibration circuit 9, which is disclosed in more detail in copending U.S. patent application Ser. No. 696,787, are associated with the amplifier 7 to vary the gain thereof, and, therefore, to normalize the respective unknown and reference electrical signals with respect to those produced when an object of known color characteristics is examined by the colorimeter 1. Below the reference to calibrated signals also implies such normalized signals. A divider switch 10 directs the unknown electrical signal after calibration to a non-inverting input of an integrator 11 for integration in one polarity direction and subsequently directs the reference electrical signal after calibration to an inverting input of the integrator for integration in a relatively opposite polarity direction. The integrator 11 accordingly integrates the unknown electrical signal for a predetermined duration and at the conclusion of that duration the electrical output of the integrator achieves a given signal level; the subsequent integration of the reference electrical signal from that given signal level causes the integrator electrical output ultimately to return to a predetermined signal level. The attaining of the latter level is detected by a comparator 12, which then produces a brief trigger or control signal for the following purposes.

During integration of the reference electrical signal electrical pulses produced by a clock oscillator 13 are counted by a conventional decade counter 14. The trigger signal produced by the comparator 12 causes a decoder output logic portion 15 briefly to open one of the three red, green or blue latch circuits 16r, 16g, 16b in the output display 5, depending on the particular color component then being detected by the sensor 3, to receive and to store the instantaneous count then on the decade counter 14. The opened latch circuit is then promptly closed and the count input thereto is stored and is delivered to one of the respective red, green or blue visual displays 17r, 17g, 17b in the output display 5. A more detailed description of this display mechanism is provided in copending U.S. patent application Ser. No. 499,479.

A reflectance cancellation circuits portion 18 stores compensating signals and delivers one to the inverting input of the integrator 11 when the latter is integrating the unknown electrical signal of a respective color light detected by the sensor 3. The integrated reflectance cancellation compensating signal is algebraically combined with the integrated unknown electrical signal for compensation of the latter with respect to reflectance error in the optics 2. Each of the stored reflectance cancellation compensating signals, one for each of the colors measured by the sensor 3, is derived as a percentage of the reference electrical signal produced during detection of the reference light beam for that color.

Primary control of the multiplexed circuits 20 is provided by a counter controller 21, which is reset by a new color reset synchronizing portion 22 at the start of detection of a new color light by the sensor 3. The counter controller 21 directly controls both the integrator 11 for integrating, holding and discharging operations and the clock oscillator 13 for turning the same on and off. Moreover, a decoder logic circuit portion 23 responds to the control signals from the counter controller 21 to effect timed multiplexed and functional control and operation of the automatic zeroing circuit 6, the calibration circuits portion 8, the divider switch 10, and the reflectance cancellation circuits portion 18. A color control counter 24 also provides to the decoder logic circuit portion 23 and to the decoder output logic portion 15 color control signals indicative of the particular color of light then being detected by the sensor 3. When the colorimeter 1 is initially energized for use, a color sequence synchronizing portion 25 detects the start of a cycle of sequential filtering of the unknown and reference light beams in the optics portion 2 to their red, green and blue components and provides to the color control counter 24 a synchronizing input which sets the latter such that the color control signals are properly indicative of the color light beam detected by the sensor 3 at any given time. After this initial synchronization of the color control counter 24, continued synchronization is maintained by the counter controller 21, which is automatically controlled by the decade counter 14 as well as by the color reset synchronizing portion 22.

Figure 2:
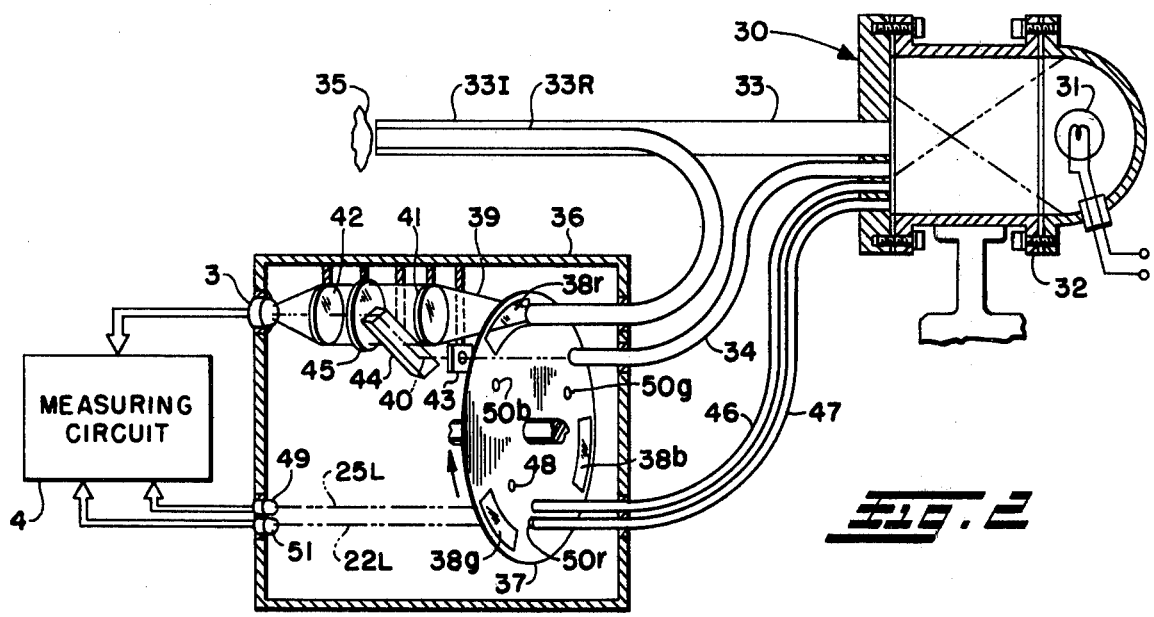
FIG. 2 is an elevation view, partly in section and perspective, of the optics portion of the colorimeter.

Turning now to FIG. 2, the elements of the optics portion 2 of the colorimeter 1 are illustrated. These elements and their operation are described in detail in the concurrently filed U.S. patent application Ser. No. 721,107 for "Comparison Type Colorimeter." A light source 30, which includes a conventional light producing lamp 31 mounted in a housing enclosure 32, provides light to unknown and reference light pipes 33, 34. The light pipes preferably are flexible and may be, for example, of either the solid or fiber type. Moreover, the unknown light pipe 33 preferably is of the bifurcated type including an incident portion 33I which directs incident light onto an object 35, such as a tooth, to illuminate the same, and a reflected light portion 33R, which receives light reflected by the object and directs that reflected light as the unknown light beam into a color detector housing 36.

A color filter wheel 37 in the housing 36 has red, green and blue color filters 38r, 38g, 38b at angularly spaced locations thereon and is rotated by a motor, not shown, in order cyclically sequentially to position each of the color filters first to filter the unknown light beam 39 from the light pipe 33R and then to filter the reference light beam schematically shown at 40 from the light pipe 34. The color filter wheel 37 otherwise blocks the unknown and reference light beams. As illustrated, the color component of the unknown light passed by the red color filter 38r, for example, is collimated by a first lens 41, and the collimated light is then concentrated by a second lens 42 onto the sensor 3, which may be, for example, a conventional photosensitive transistor. The sensor 3 then produces its unknown electrical signal indicative of the intensity of the light impinging thereon. At this time the reference light beam 40 is blocked by the color filter wheel 37. Subsequently, after the color filter wheel 37 has rotated in a clockwise direction, for example, relative to the illustration of FIG. 2, the color filter wheel will block the unknown light beam 39 and the red color filter 38r will pass the red color component of the reference light beam 40 to an aperture plate 43. The portion of the reference light beam passing the aperture plate is directed by a prism 44 to the second lens 42 which concentrates the reference light beam onto the sensor 3 causing the latter to produce its reference electrical signal indicative of the intensity of the red color component of the reference light beam impinging thereon. The color filter wheel 37 operates similarly to pass the green and blue color components of the unknown and reference light beams. An infrared filter 45 is positioned in the housing 36 to filter infrared light or radiation, which may be transmitted by the respective color filters 38r, 38g, 38b, from both the reference and unknown light beams.

A quantity of light from the light source 30 also is received by a pair of synchronizing light pipes 46, 47 which direct the received light to the color detector housing 36. More specifically, the light pipe 46 directs a color sequence synchronizing light beam 25L toward the color filter wheel 37, and when an opening 48 therein aligns with the light pipe 46 just prior to the aligning of the red color filter 38r in position to filter the unknown light beam 39, which constitutes the start of a rotational and filtering cycle of the color filter wheel, the light beam 25L is passed to a photosensor 49. The photosensor 49, which is coupled to the color sequence synchronizing portion 25 of the measuring circuit 4 shown in FIGS. 1 and 3, then poduces an electrical signal to set the color control counter 24 in readiness to control the measuring circuit 4 for measuring red light.

Moreover, three additional openings 50r, 50g, 50b are angularly located in the color filter wheel 37 to pass a new color reset synchronizing light beam 22L from the second synchronizing light pipe 47 to an additional photosensor 51 whenever a respective color filter, such as the color filter 38r, is aligned in the unknown light beam, as illustrated. The additional photosensor 51 is coupled to the new color reset synchronizing portion 22 of the measuring circuit 4 and upon receiving a light input produces an electrical signal output to the new color reset synchronizing portion which then indicates to the counter controller 21 that measurement of the unknown electrical signal from the sensor 3 should commence and, accordingly, resets the counter controller. Since the color control counter already had been set initially by the color sequence synchronizing light beam 25L, as described, the measuring circuit 4 now is ready to measure red light, i.e. to make a comparison of the red color component of the unknown light beam 39 with that of the reference light beam 40, and the following description is directed to making such measurement. The measuring circuit 4 would also operate similarly to measure green and blue light, as will be outlined briefly below.

In the measuring circuit 4, the various multiplexed circuits 20 are employed both to obtain effecient use of several circuit elements and to assure the accuracy of the measurements made by the measuring circuit. In particular, a single sensor 3 is used to detect both the unknown and the reference light beams, thus eliminating possible variations between plural sensors. Moreover, the unknown and reference electrical signals travel through exactly the same circuits to the integrator whereat their comparison is effected, thus eliminating differential drifting and the like between circuit elements of separate unknown and reference circuits previously used. Both the unknown and reference electrical signals pass through the same circuits of the automatic zeroing circuit 6 and are amplified in the same manner by the amplifier 7, albeit the amplifier 7 is selectively set up to have different respective gains by the multiplexed calibration circuits portion 8; and the unknown and reference electrical signals after calibration are delivered by the divider switch 10 directly to the respective non-inverting and inverting inputs of the integrator 11. By thus maintaining the unknown and reference electrical signals accurately indicative of the unknown and reference light beams of each color that sequentially impinge on the sensor 3, the digital values usually displayed in the display 17 will accurately represent the intensities of the color components of the unknown light beam.

In the following description elements designated by reference numerals having a suffix of r, g or b, which refer to red, green and blue, respectively, are repeated in the measuring circuit 4, once for each color ordinarily measured, and the operation of the elements of each such grouping is the same. Moreover, the expressions red unknown electrical signal and red reference electrical signal implies those electrical signals which are produced by the sensor and are subsequently calibrated or amplified when the red color component of the unknown and reference light beams impinge thereon; similar meanings are attached to the green and blue unknown and reference electrical signals, respectively.

Referring now to FIG. 3 wherein the schematic diagram of the measuring circuit 4 is shown in detail, the several positive terminals 60 indicate a power input of, for example, 12 volts DC from a conventional supply, not shown; the several internal circuit ground terminals 61 indicate a connection to the same source at a ground potential relative to the terminals 60; and the chassis ground terminals 62 are connected to the chassis and external ground of the colorimeter instrument. Ordinarily the relative potential of the internal circuit ground terminals 61 would be maintained slightly higher than that of the chassis ground terminals to assure suitable potential differences across respective circuit elements for proper operation thereof. However, if desired, the circuit operating parameters may be designed such that the terminals 61 and 62 are coupled together and maintained at a common ground potential.

When the color sequence synchronizing light beam 25L passes through the color filter wheel 37 of FIG. 2 and impinges on the photosensor 49, the latter causes the amplifier 63 in the color sequence synchronizing portion 25 to produce a brief positive signal on its output line 64. The signal is directed to the reset inputs of a JK flip-flop 65 of the color control counter 24 to provide the initial synchronization setting of the latter. The JK flip-flop 65 has two stages with the four illustrated outputs designated $Q_1$, $\overline{Q}_1$, $Q_2$ and $\overline{Q}_2$. Both stages of the flip-flop 65 are coupled by the line 66 to receive a clocking control signal periodically from the counter controller 21, such signal causing a sequential counting operation by the flip-flop 65 after the latter has initially been set by the color sequence synchronizing portion 25.

The two stages of the flip-flop 65 are interconnected, as illustrated, to provide first, second and third count conditions in each of which the four respective $Q_1$, $\overline{Q}_1$, $Q_2$, $\overline{Q}_2$ outputs specifically assume relatively high or logic 1 signals, say at about 12 volts DC, or relatively low or logic 0 signals, say zero volts. Chart I below shows the logic signals at the four flip-flop outputs for the three count conditions thereof.

CHART I

| OUTPUT | $Q_1$ | $\overline{Q}_1$ | $Q_2$ | $\overline{Q}_2$ |
|---|---|---|---|---|
| First count | 0 | 1 | 0 | 1 |
| Second count | 1 | 0 | 0 | 1 |
| Third count | 1 | 0 | 1 | 0 |

When the flip-flop 65 is initially set by the color sequence synchronizing portion 25, it assumes the first count condition, which indicates in the preferred embodiment that red light is the next color to be detected by the sensor 3 and to be measured by the measuring circuit 4. The next clocking control signal from the counter controller 21 causes the flip-flop 65 to assume a second count condition, which indicates that green light is the next to be detected and measured, and the still next clocking control signal causes assumption of the third count condition similarly indicative of blue light. The following clocking control signal, which normally would occur before the color sequence synchronizing portion 25 produces a pulse on line 64, causes the flip-flop 65 to assume the first count condition again; therefore, after its initial set by the color sequence synchronizing portion, the color control counter automatically remains synchronized with the color wheel via the clocking control signals from the counter controller.

Upon being initially set to its first count condition, the flip-flop 65 in the color control counter 24 produces on logic lines 67, 68, 69, 70 logic 0, 1, 0, 1 signals respectively. Shortly afterwards the color filter wheel 37 rotates the opening 48 out of the path of the color sequence synchronizing light beam 25L and the opening 50r into alignment with the new color reset synchronizing light beam 22L, which passes to the additional photosensor 51 that causes an amplifier 71 in the new color reset synchronizing portion 22 briefly to produce a reset pulse on the line 72 to reset the counter controller 21. This resetting preferably occurs when the red color component filtered by the color filter 38r from the unknown light beam 39 is impinging on the sensor 3.

The counter controller 21 may be a conventional decade counter type circuit that is reset to a zero count condition by the reset pulse applied to the reset terminal 21R thereof. The counter controller has five outputs coupled, respectively, to apply to control lines 73 through 77 logic 0 and logic 1 signals depending on the count condition of the counter controller. In its zeroth count condition the counter controller 21 applies a logic 1 signal to the control line 73 and logic 0 signals to the other control lines and in second, third, fourth and fifth count conditions the counter controller applies logic 1 signals to the control lines 74 through 77, respectively, and logic zero signals to the remaining control lines. The counter controller 21 has a first count condition during which all control lines 73 through 77 receive logic 0 signals.

Upon being reset, as described, the counter controller 21 produces a logic 1 signal on the control line 73. This signal is inverted by an inverting amplifier 78 in the decoder logic circuit portion 23 such that a logic 0 signal is directed to the electronic switch 79, which, as the other electronic switches described herein, may be a conventional transistorized bilateral gate switch or the like, to open the same. The logic 1 signal on the control line 73 also is directed to the several triple input AND gates 80r, 80g, 80b in the decoder logic circuit portion 23, for example, to reverse bias the diode 81r. Moreover, since the flip-flop 65 in the color control counter 24 is in its first count condition, logic 1 signals on the logic lines 68 and 70 also reverse bias by the diodes 82r, 83r. Therefore, a relatively high or logic 1 signal is provided on the control input 84r of the electronic switch 85r closing the same to place the red calibrating circuit channel 86r in feedback connection to the amplifier 7.

The unknown electrical signal produced by the sensor 3 in response to the red component of the unknown light beam impinging thereon is delivered to the non-inverting input 87 of a pre-amplifier 88, which has a rough calibration or trimming potentiometer 89 coupled in feedback relation thereto for controlling the gain thereof to maintain the various elements of the measuring circuit 4 operating in their normal ranges and to obtain an optimum signal-to-noise ratio. At this time the logic 0 signal on the control line 76 maintains the electronic switch 90 in the automatic zeroing circuit 6 opened so that the pre-amplified unknown electrical signal is coupled by a capacitor 91 in the automatic zeroing circuit to the non-inverting input 92 of the amplifier 7 for further amplification thereby. Both the preamplifier 88 and the main amplifier 7 preferably are high input impedance operational amplifiers to obtain optimum signal isolation and gain control capabilities.

The red calibrating circuit channel 86r, which is now coupled to the amplifier 7 by the counter controller 21 and color control counter 24 operating through the decoder logic circuit portion 23 to close the electronic switch 85r, includes a voltage divider impedance network 93r, which is adjustable to establish a basic gain of the amplifier 7 when connected thereto, and a potentiometer 94r, which is adjustable to establish a range of permissible change of that basic gain. The electronic switch 85r couples the red calibrating circuit channel 86r between the output and the inverting input 95 of the amplifier 7.

Moreover, the single adjustment calibrating circuit 9 includes a series connected potentiometer 96 and resistor 97, which have a combined impedance that is much greater than that of the voltage divider 93r, also connected to the inverting input 95. That combined impedance also is greater than that of each of the voltage dividers 93g, 93b in the green and blue calibrating circuit channels 86g, 86b. Therefore, as is described in more detail in copending application Ser. No. 696,787, adjustment of the potentiometer 96 will determine the percentage of the ranges of permissible change of the basic gains for each calibrating circuit channel that the basic gains are actually changed. The electrical signals produced by the sensor may drift different respective amounts, for example, due to aging, temperature variations, or the like, for each color detected thereby. It is the principal purpose of the single adjustment calibration circuit to compensate the gain of the amplifier 7 simultaneously for such drifting as is described in the mentioned application.

The basic gain of the amplifier when the red calibration circuit 86r is coupled thereto ordinarily would be determined experimentally by optically examining and measuring a reference object 35 of known red color characteristics and adjusting the voltage divider 93r until appropriate red color values would be displayed by the red display 17r while the range adjusting and single adjustment potentiometers 94r, 96 are turned to present minimum and maximum impedances, respectively. The green and blue calibration circuits 86g, 86b would be similarly adjusted. Later, after the measuring circuit 4 had substantially fully aged or fatigued, the single adjustment potentiometer would be turned to present minimum impedance and the respective range adjusting potentiometers would be adjusted, while the reference object is still examined, to bring the respective displayed color values back to their original values. Thereafter, when subsequently using the colorimeter 1, as drifting occurs, only the single adjustment potentiometer 96 usually would require adjustment to correct the amplifier simultaneously for different amounts of drifting with respect to each color measured.

Thus, the unknown electrical signal is amplified by the amplifier 7, as set up to have a gain determined by the impedance of the red calibrating circuit channel 86r and the single adjustment calibration circuit 9, to provide such signal on the line 98.

The logic 1 signal presently on the control line 73 also is simultaneously delivered to the divider switch 10 to close the electronic switch 100U, which coupled the unknown electrical signal, after calibration, on the line 98 to the non-inverting input 101 of the amplifier 102 of the integrator 11, which additionally includes an integrating capacitor 103 connected between the amplifier output 104 and the inverting input 105. The amplifier 102 also has an offset circuit for adjustment in conventional manner. The electronic switch 106, which couples the side of the integrating resistor 107 remote from the inverting input 105 to the internal ground terminal 61, and the electronic switch 108 in the reflectance cancellation circuits portion 18 also receive the logic 1 signal on the control line 73 and, therefore, close.

Since the logic lines 68 and 70 are at logic 1 signal levels at this time, the diodes 109r, 110r of a double input AND gate 111r in the decoder output logic portion 15 are reverse biased so that the positive signal at the terminal 60 produces a logic 1 signal on the line 112r to close an electronic switch 113r in the reflectance cancellation circuits portion 18. Also, since the electronic switch 108 is closed, a red compensating signal stored in the storage capacitor 114r in the reflectance cancellation circuits portion 18 is delivered to the inverting input 105 of the integrator 11 for integration simultaneously with the red unknown electrical signal. The red compensating signal ordinarily would be placed for storage in the capacitor 114r during part of the previous cycle in which red light were measured, as will be described further below. The stored red compensating signal is a percentage of the red reference electrical signal on the line 98, after calibration, and the adjustable voltage divider 115r determines that percentage. A high impedance amplifier 116, which is connected with a unity gain feedback loop 117, provides signal isolation to avoid draining the storage capacitor 114r and delivers the red compensating signal via the closed electronic switch 108 and a resistor 118 to the inverting input 105 of the integrator 11.

Thus, simultaneous integration of the red unknown electrical signal on the line 98, after calibration, and of the red compensating signal is commenced and proceeds for a predetermined duration, which is established as follows. The logic zero signal appearing on the control line 77 from the counter controller 21 is inverted by an inverting amplifier 119 and provided at a control input 120 of the clock oscillator 13, which turns on and produces electrical pulses on the clock output line 121 to start the predetermined duration. The electrical pulses on the line 121 are delivered via a transistor output 122 to the input of the decade counter 14, which counts the number of electrical pulses received. In the preferred embodiment the decade counter 14 actually counts up to a predetermined maximum count of 400 and then automatically resets itself back to zero to commence counting the next 400 pulses, for example, in conventional manner. Moreover, upon reaching the predetermined count of, for example, 400, or other predetermined count level, if desired, a brief signal indicative of the achieving of such predetermined count and the resetting of the decade counter is produced by the latter in conventional manner on the line 123 for delivery via a resistor 124, diode 125 and inverting transistor 126 as a clock signal on the line 127 to the clock input 21C of the counter controller 21, which would cause the latter to switch to its next count condition. Upon switching from its zeroth to its first count condition, the counter controller terminates the mentioned predetermined duration.

Figure 4:
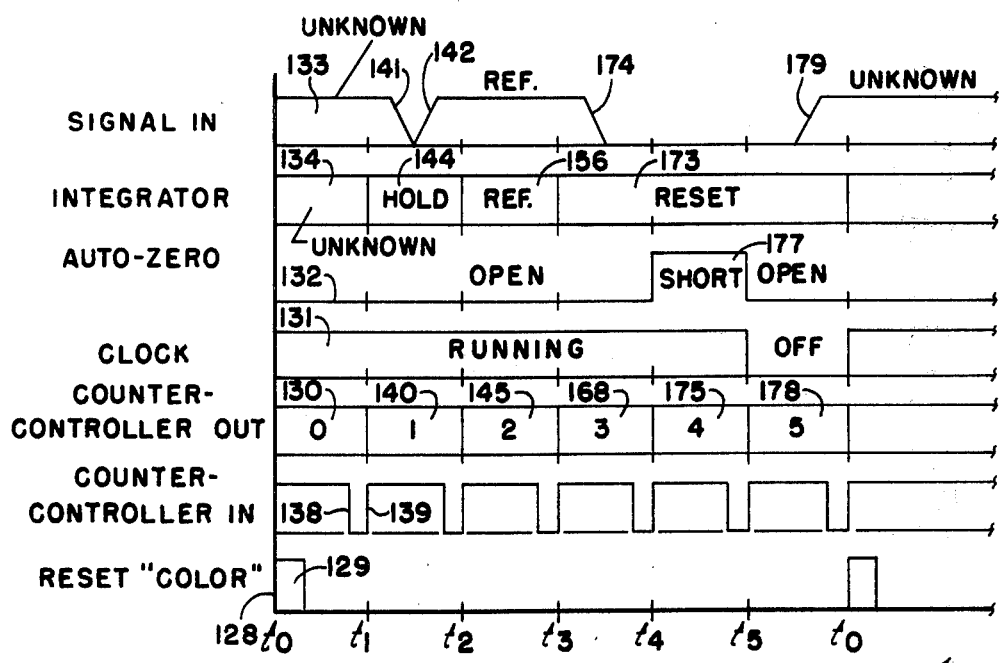
FIG. 4 is a chart depicting the operation of portions of the circuitry of FIG. 3.

The above described operation is summarized in part in the Chart of FIG. 4 commencing at time $t_0$. Accordingly, at time $t_0$ the leading edge 128 of a reset color pulse 129, which appears at line 72 between the new color reset synchronizing portion 22 and the reset input 21R of the counter controller 21 resets the latter; the counter controller is, therefore, placed in its zeroth count condition, as indicated in block 130; the clock oscillator 13 and decade counter 14 are running, as indicated by block 131; the electronic switch 90 is open so that the automatic zeriong circuit 6 is disabled, as indicated by the line 132; the unknown light beam signal 39 of FIG. 2 is impinging on the sensor 3, as indicated by the block 133; and the integrator 11 is integrating the unknown electrical signal, after calibration, and simultaneously the compensating signal from the reflectance cancellation circuits portion 18, as indicated by the block 134.

Figure 5:
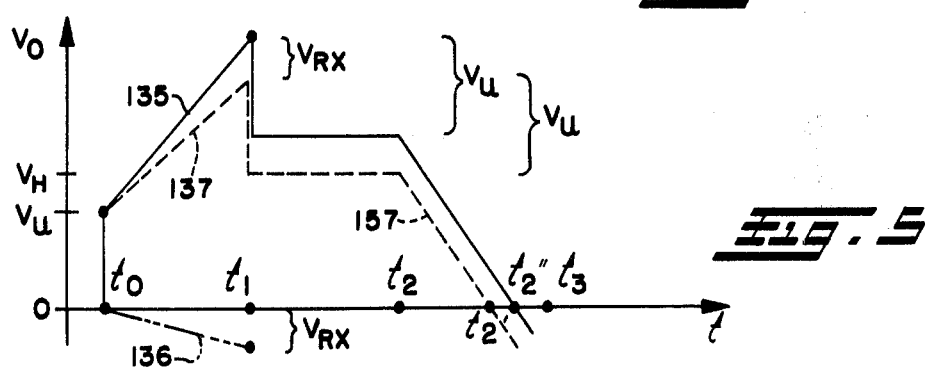
FIG. 5 is a graph depicting operation of the dual slope integrator in the circuitry of FIG. 3.

In the graph of FIG. 5 the electrical output, as an integrated voltage leverl $V_0$, of the integrator 11 during operation thereof is shown. The times $t_0$, $t_1$, $t_2$ and $t_3$ indicate durations or times corresponding to those indicated on the Chart of FIG. 4.

In the graph of FIG. 5, the solid line 135 illustrated represents the value of the electrical output voltage level $V_0$ of the integrator 11 without considering the effect of the integration of the compensating signal 136, which is shown in phantom; and the dashed line 137 illustrates the value of the electrical output voltage level $V_0$ with such compensating signal considered and, accordingly, algebraically combined with the unknown electrical signal during integration.

At the time $t_0$ on the graph of FIG. 5 the red unknown electrical signal is delivered by the electronic switch 100U in the divider switch 10 to the non-inverting input 101 of the integrator amplifier 102 immediately causing the electrical output of the integrator as well as the lefthand side of the integrating capacitor 103 instantly to jump to a value $V_u$, the instantaneous voltage of the red unknown electrical signal. This is shown by the solid line 135 in FIG. 5. Between time $t_0$ and $t_1$, the red unknown electrical signal is integrated in usual manner and would cause the electrical output to follow the solid line 135 of the graph of FIG. 5 over that predetermined duration. Due to the instant jump of the output voltage level $V_0$ at time $t_0$ the mentioned integration will proceed according to the formula $$V_o = V_u + \frac{1}{RC} \int_{t_0}^{t_1} V_u dt,$$

wherein R is the resistance of the resistor 107, C is the capacitance of the capacitor 103 and the time constant RC is much larger than the predetermined duration between times $t_0$ and $t_1$. Without considering the effect of the compensating signal, at time $t_1$, as will be described further below, the switch 100U will be opened and the red unknown electrical signal $V_u$ will be removed from the non-inverting input 101 to stop the integration thereof, and, therefore, the output voltage level $V_0$ will drop by an amount $V_u$ so that the resulting value of the output voltage level $V_0$ after the integration of the unknown electrical signal $V_u$ would truly be representative of the time integral of the latter over the predetermined duration.

However, during integration of the red unknown electrical signal the red compensating signal also is integrated. Without considering the simultaneous integration of the unknown electrical signal, the integration of the compensating signal would cause the electrical output of the integrator 11 to follow the phantom line portion 136 of the graph of FIG. 5 until a reflectance cancellation voltage $V_{RX}$ would be achieved at time $t_1$, the end of the predetermined duration.

The unknown electrical signal and the compensating signal are algebraically combined during the integration thereof and, accordingly, the voltage level output $V_0$ of the integrator 11 actually will follow the dashed line portion 137 of the graph of FIG. 5.

At time $t_1$ ending the predetermined duration for the integration of the unknown electrical signal a pulse from the decade counter 14 causes the transistor 126 briefly to bring the line 127 to relative ground potential, as indicated at the leading edge 138 of the electrical signal illustrated in the Chart of FIG. 4. The positive-going trailing edge 139 of that electrical signal, which is exaggerated in width for clarity in the drawing, appears at the clock input 21C as a clock signal to the counter controller 21 to switch the latter to its next count condition, in this case to its first count condition indicated at the block 140 of the Chart.

This first count condition of the counter controller 21 provides a hold time interval between times $t_1$ and $t_2$ during which the red color filter 38r is rotated out of alignment with the unknown light beam 39 and into alignment with the reference light beam 40 so that the light signal impinging on the sensor 3 generally follows the lines 141, 142 in the Chart.

Moreover, during the hold time interval all of the control lines 73 through 77 of the counter controller 21 receive logic zero signals. Therefore, the inverting amplifier 78 provides a logic 1 signal to the electronic switch 79 turning the same on to provide an assured unity gain feedback loop for the amplifier 7. Also, the diode 81r in the triple input AND gate 80r is no longer reversed biased and, therefore, the electronic switch 85r is turned off to uncouple the red calibrating circuit channel 86r from the amplifier 7. The electronic switches 100U, 106 and 108 are all opened so that the voltage lever $V_0$ of the electrical output of the integrator 11 is held constant at its achieved integrated level indicated $V_H$ at dashed line portion 143 on the graph of FIG. 5. The hold condition of the integrator is indicated in block 144 on the Chart of FIG. 4. The logic zero signal on the control line 77 is inverted by the inverting amplifier 119 to assure that the clock oscillator 13 continues to produce electrical pulses on the clock output line 121, and, therefore, the decade counter 14 will continue counting those pulses.

When the color filter wheel 37 has properly aligned the red color filter 38r to pass the red color component of the reference light beam 40 to the sensor 3, while the unknown light beam 39 is now blocked by the wheel, the decade counter 14 for the second time reaches a count of 400. As described above, the decade counter again resets itself and at the same time produces a clock signal to switch the counter controller 21 to its second count condition, whereby a logic 1 signal is produced on the control line 74 at time $t_2$ while the other control lines remain at logic 0.

During the second count condition of the counter controller 21, as indicated in block 145 of the Chart, the logic 1 signal on the control line 74 and the logic 1 color control signals on the logic lines 68 and 70 from the flip-flop 65 of the color control counter 24 cause all three of the diodes 150r, 151r, and 152r of a triple input AND gate 153r of the decoder logic circuit portion 23 to be reversed biased, whereby the logic 1 signal on the control line 74 operates through the resistor 154r to turn on the electronic switch 155r. The red reference electrical signal produced by the sensor 3 is pre-amplified by the pre-amplifier 88, is passed by the capacitor 91 since the electronic switch 90 is off, is further amplified with unity gain by the amplifier 7 since the electronic switch 79 is on and is applied to the line 98. The closed electronic switch 155r allows the storage capacitor 114r to be recharged to a voltage level that is a percentage determined by the voltage divider 115r of the reference electrical signal, after calibration by unity gain amplification of the amplifier 7 in this case, on the line 98. That percentage would be determined experimentally, for example, by determining the percentage of red incident light applied by the light source 30 to the incident portion 33I of the light pipe 33 that is internally reflected into the reflectance portion 33R without actually impinging on the object 35. The same experimental compensating type procedure would be followed to determined similar green and blue compensating signals for storage in capacitors 114g and 114b by adjustments of the voltage dividers 115g, 115b.

The logic 1 signal on the control line 74 also turns on the electronic switch 100R in the divider switch 10 to deliver the reference electrical signal, after calibration, on the line 98 to the inverting input 105 of the amplifier 102 of the integrator 11. Therefore, the integrator 11 will integrate the reference electrical signal in the opposite polarity direction relative to that of the earlier integration of the unknown electrical signal, as indicated by block 156 in the Chart. The electrical output voltage level $V_0$ of the integrator then will be reduced according to the dashed line portion 157 of the graph of FIG. 5. At time $t_2'$ the electrical output voltage level $V_0$ reaches a zero voltage level, and the zero crossing comparator 12 detects the same and produces a trigger signal on the line 158. If desired, the zero crossing comparator 12, which is a conventional comparator device such as that disclosed in the copending application Ser. No. 499,479, may be adjusted to produce the indicated trigger signal when the electrical output voltage level $V_0$ achieves during integration of the reference electrical signal a predetermined level other than a zero voltage level.

The time $t_2''$ on the graph of FIG. 5 indicates the time, relatively later than time $t_2'$, at which the integrator output voltage level $V_0$ would reach zero voltage if the unknown electrical signal were not compensated for reflectance error. Therefore, without such compensation the also realtively later produced trigger signal would cause the latches 16 to receive and to store incorrect electrical output signals from the decade counter 14, as will be described further below.

The trigger signal from the zero crossing comparator 12 is synchronized with the electrical pulses from the clock oscillator 13 in a NAND gate 150 so that when both a trigger signal and an electrical pulse are provided thereto a logic zero signal is produced thereby. The inverting amplifier 160 then produces a logic 1 signal on the line 161 as an input to each of the three triple input NAND gates 162r, 162g, 162b in the decoder output logic portion 15.

As was mentioned above, both diodes 109r, 110r in the AND gate 111r are reverse biased by logic 1 signals on the logic lines 68 and 70 from the color control counter 24 and, therefore, that AND gate causes a logic 1 signal to be delivered to a second one of the inputs to the NAND gate 162r. Moreover, closure of an update control switch 163, which may be a finger switch, a foot switch or the like manually operated by the dentist or technician who is using a colorimeter 1, will cause the inverting amplifier 164 to produce a logic 1 signal on the line 165 as the third logic 1 signal input to the NAND gate 162r. Therefore, the NAND gate 162r produces a logic 0 output signal to turn off conduction in the transistor 166r, which permits a logic 1 signal to be provided at the terminal 167r coupled to the latch circuit 16r in the latch mechanism 16 briefly to open that latch to receive the count then on the decade counter 14 as an update of the magnitude of the intensity of the red color component of the unknown light beam. As soon as the electrical pulse from the clock oscillator 13 on the line 121 is terminated, the NAND gate 159, inverting amplifier 160, NAND gate 162r, and transistor 166r remove the logic 1 signal from the terminal 167r immediately to close the latch 16r, which then maintains the updated count stored therein and provides the same to the visual display 17r in the display portion 17. By the time the next electrical pulse is produced by the clock oscillator, the trigger signal from the zero crossing comparator 12 normally will have been removed from the line 158 and, therefore, the latch circuit 16r is maintained closed until the colorimeter in the next full cycle of the color filter wheel 37 and measuring circuit 4 measures the red color component of the unknown light beam.

Thus, it will be clear that the magnitude of the count signal applied to and stored in the latch circuit 16r is directly proportional to the duration of time required for integration of the reference electrical signal by the integrator 11 to bring the electrical output voltage level $V_0$ thereof from its achieved integrated level, in this case $V_H$, back to a predetermined level, in this case zero volts, which duration is indicated on the graph of FIG. 5 between the times $t_2$ and $t_2'$.

Although the latch circuit 16r had been opened, updated, and closed again, as described, the decade counter 14 continues to count the electrical pulses produced by the clock oscillator 13 and when the 400 count is attained again at time $t_3$ the decade counter resets itself and simultaneously causes production of a clock signal to switch the counter controller 21 to its third count condition, as indicated in block 168 in the Chart of FIG. 4.

When the counter controller is in its third count condition, the control line 74 receives a logic 0 signal that turns off the AND gate 153r, which turns off the electronic switch 155r so that the red compensating signal remains stored in the capacitor 114r, and that logic 0 signal also turns off the electronic switch 100R to remove the red reference electrical signal from the inverting input 105 of the integrator. Also a logic 1 is now provided on the control line 75 to reset the integrator 11 by closing the electronic switch 169, which then turns on and discharges the integrating capacitor 103. Moreover, the arrangement of diodes 170, 171, 172, assures that such discharging resetting operation, as indicated at the elongated block 173 in the Chart of FIG. 4, will continue during the third, fourth and fifth count conditions of the counter controller 21 over the time period between the times $t_3$ and $t_6$.

While the counter controller 21 is in its third count condition, the clock oscillator 13 continues to produce electrical pulses and the decade counter 14 continues to count the same. Moreover, at same time during the third count condition the red color filter 38r will be rotated by the color filter wheel 37 out of alignment with the reference light beam 40 so that substantially zero light will impinge on the sensor 3, as is indicated by the light intensity signal representation line portion 174 in the Chart of FIG. 4. When the decade counter reaches its 400 count again, it resets itself simultaneously and causes a clock signal to switch the counter controller 21 to its fourth count condition, as indicated in block 175 of the Chart.

When the counter controller 21 is in its fourth count condition, a logic 1 signal on the control line 76, in addition to maintaining the electronic switch 169 turned on, provides a clocking control signal on the line 66 to both stages of the flip-flop 65 in the color control counter 24 causing the flip-flop to change to its second count condition, whereby, as indicated in Chart I above, logic 1 signals are placed on logic lines 67 and 70 and logic 0 signals are placed on logic lines 68 and 69. Therefore, the AND gate 111r in the decoder output logic portion 15 is turned off, i.e. causes a logic 0 to be applied to an input of the NAND gate 162r, and the AND gate 111g turns on to provide a logic 1 to an input of the green NAND gate 162g to enable the latter to turn off the transistor 166g when the next "green" trigger signal is received from the zero crossing comparator 12 and the update switch 163 is closed, thereby to update the green storage latch 16g and green display 17g in the same manner described above.

Additionally, the logic 1 signal on the control line 76 turns on the electronic switch 90 in the automatic zeroing circuit 6 to discharge the capacitor 91 through the resistor 176. Therefore, the righthand side of the capacitor 91 coupled to the non-inverting input 92 of the amplifier 7 will be brought to the internal ground potential of the terminal 61 and the left side of the capacitor 91 will assume a voltage that is representative of the dark current or leakage current through the sensor 3 since no light is then impinging on the sensor. This operation of the automatic zeroing circuit 6 to discharge the capacitor 91 is indicated by block 177 in the Chart of FIG. 4.

The fifth count condition of the counter controller 21, as indicated at block 178 in the Chart of FIG. 4, occurs when the decade counter 14 again reaches a count of 400 and resets itself as described above. The control line 77 then receives a logic 1 signal, which is directed through the diode 69 to maintain the electronic switch 169 turned on to continue discharging the capacitor 103 to reset the integrator 11. Moreover, the logic 1 signal on the control line 77 is inverted by the inverting amplifier 119, which provides a logic 0 signal on the control input 120 of the clock oscillator 13 to turn the clock oscillator off, thus stopping any electrical pulses from being produced on the clock output line 121. As is shown by the line portion 179 on the Chart, sometime during the period of the fifth count condition between times $t_5$ and $t_0$ again the green color filter 38g will have been rotated by the color filter wheel 37 to pass the green color component of the unknown light beam 39 from the light pipe 33R to the sensor 3, whereby the latter receives the green unknown light beam signal.

Moreover, at the time $t_5$ the previous logic 1 signal is removed from the control line 76 and is replaced by a logic 0 signal which turns off the electronic switch 90 in the automatic zeroing circuit 6 to stop discharging the capacitor 91. Therfore, when the unknown light beam again impinges on the sensor 3, which will occur relatively promptly after the electronic switch 90 has been turned off, the green unknown electrical signal will promptly be pre-amplified by the pre-amplifier 88, will pass the capacitor 91 and will be provided to the noninverting input 92 of the amplifier 7 for amplification thereby.

The complete operation of the measuring circuit 4 through one complete controlled counting cycle of the counter controller 21 from its zeroth count condition to its fifth count condition has now been described for measurement, for example, of the red color component of the unknown light beam with resepct to the red color component of the reference light beam to develop a digital output signal indicative of the ratio of the red components of those light beams. Similar operation of the measuring circuit 4 will subsequently sequentially occur to obtain measurements of the green and blue color components of the unknown light beam, respectively, thus completing one complete cycle of the colorimeter. This cyclical operation ordinarily may be continued, as desired; and as long as any change in the intensity of the light source 30, for example, due to aging is relatively slow or insignificant as compared to the speed with which each complete cycle of the color filter wheel 37 and measuring circuit 4 occurs, the output signals will accurately represent the color of the object 35 without regard to the absolute intensity of the light source.

Continuing in the cycle to measure the next color, a new color reset synchronizing light beam 22L will impinge on the additional photosensor 51 via the additional opening 50g in the color filter wheel 57 when the green color filter 38g is fully aligned to pass the green color component of the unknown light beam 39 to the sensor 3. The reset pulse produced then by the new color reset synchronized portion 22 resets the counter controller 21, to its zeroth count condition placing a logic 1 signal on the control line 73. The triple input AND gate 80g, which already has been enabled by the logic 1 signals provided by the color control counter 24, turns on the electronic switch 85g, which couples the green calibration circuit channel 86g to the amplifier 7. Therefore, the unknown electrical signal is approriately calibrated for properly representing the intensity of the green color component of the unknown light beam, and that calibrated signal is integrated by the integrator 11 which at the same time integrates the green compensating signal that had been stored earlier in the storage capacitor 114g and is now passed by the electronic switch 112g that is enabled by the AND gate 111g.

After the several above-described operations occur in the measuring circuit 4 under control of the counter controller 21, as described above, to obtain a display of updated green color values, the blue color component of the unknown light beam will be measured and displayed in similar manner.

At the conclusion of the measurement of the blue color component the production of the fourth count condition by the counter controller 21 to place a logic signal on the control line 76 causes the flip-flop 65 in the color control counter 24 to revert to its first count condition. This first count condition of the color control counter is then maintained even though a subsequent signal is delivered by the color sequence synchronizing portion 25 when the color filter wheel 37 is about to begin its cycle and the opening 48 has passed the color sequence synchronizing light beam 25L to the photosensor 49.

The above-described operation will continue to occur in the cyclical manner, whereby the red, green and blue color components of the unknown light beam will continuously be measured with respect to the corresponding color components of the reference light beam and the values stored in the respective latches 16 and displayed in the respective displays 17 will continuously be updated. Of course, whenever the update switch 163 is opened, the decoder output logic portion 15 is prevented from opening respective latches and updating them. Therefore, the dentist may place the light pipe 33 to engagement with a portion of a tooth and close the switch 163 to provide for a displaying of the color components of the tooth at the particular area examined. Before the light probe is removed from that area, the update switch 163 would be opened so that the measured and displayed color values will be retained in the latches and the displayed values may be written down.

It will now be clear that the colorimeter 1 provides for the measurement of plural colors of an object and the production of electrical output signals that preferably are displayed in digital form as color values indicative of the color of such object.

The embodiments of the invention in which an exclusive property or privilege is claimed are defined as follows:

1. A comparison type optical measuring apparatus, comprising:

photosensitive means for producing an electrical output representative of light received thereby, optical means for sequentially directing unknown and reference light beams to said photosensitive means thereby to cause said photosensitive means to produce, respectively, unknown and reference electrical signals, integrator means for integrating in one polarity direction one of said unknown and reference electrical signals for a predetermined duration to produce an integrated signal level and then in the opposite polarity direction the other of said unknown and reference electrical signals, and common circuit means for directing said unknown and reference electrical signals to said integrator means output means for producing an electrical output signal indicative of the time required for said integrator means to integrate said other of said unknown and reference electrical signals from such integrated signal level to a predetermined signal level, whereby said electrical output signal is representative of a comparison of said unknown and reference light beams.

2. The apparatus of claim 1, further comprising display means coupled to said output means for visually displaying the value of said electrical output signal in digital form as an indication of the relative intensity of said unknown light beam.

3. The apparatus of claim 1, wherein said photosensitive means comprises a single photosensitive means for respectively detecting both said unknown and reference light beams.

4. The apparatus of claim 1, wherein said optical means further comprises color filter means for filtering both said unknown and reference light beams.

5. The apparatus of claim 4, wherein said color filter means comprises a plurality of different color filters and means for cyclically sequentially interposing each color filter in said unknown and reference light beams, whereby for each color light detected by said photosensitive means respective pairs of unknown and reference electrical signals are produced.

6. The apparatus of claim 5, said common circuit means comprising calibrating means for adjusting the magnitude of said electrical output signal, said calibrating means including amplifier means operatively coupled between said photosensitive means and said integrator means for amplifying the electrical output of the former prior to delivery to the latter, and means for changing the gain of said amplifier means for each color of said unknown light beam detected by said photosensitive means.

7. The apparatus of claim 6, wherein said means for changing includes a plurality of circuit channels, each including at least one selectively adjustable impedance means for establishing respective basic gains for said amplifier means, and the apparatus further comprising multiplexing means for operatively coupling respective circuit channels to said amplifier means when respective colors of said unknown light beam are detected by said photosensitive means.

8. The apparatus of claim 7, further comprising means in each of said circuit channels for determining respective limited ranges of permissible change of the gain of said amplifier means as a percentage of the basic gain thereof when said circuit channels are respectively connected thereto, and single adjustable impedance means for controlling the fractional amount of each of such limited ranges of permissible change that the amplifier means gains are changed.

9. The apparatus of claim 7, wherein said calibrating means further includes circuit channel means for establishing a predetermined gain for said amplifier means, and wherein said multiplexing means further includes further means for operatively coupling said circuit channel means to said amplifier means when said respective reference light beams are detected by said photosensitive means.

10. The apparatus of claim 9, wherein said circuit channel means establishes substantially unity gain for said amplifier means.

11. The apparatus of claim 9, wherein said further means for operatively coupling couples said circuit channel means to said amplifier means whenever said unknown light beam is not being detected by said photosensitive means.

12. The apparatus of claim 6, further comprising multiplexing means for cyclically sequentially operatively coupling said means for changing to said amplifier means to establish respective gains for the latter.

13. The apparatus of claim 12, further comprising means for indicating to said multiplexing means the color light being detected by said photosensitive means thereby to synchronize said multiplexing means and said optical means.

14. The apparatus of claim 13, wherein said means for changing includes a plurality of circuit channel means for establishing respective gains for said amplifier means, said multiplexing means includes counter-like controller means for controlling respective operative couplings of said circuit channel means and said amplifier means, and said indicating means includes first means for indicating to said controller means the initiation of a cycle of sequential interposing of respective color filters in said light beams and second means for indicating to said controller means that a color filter has become interposed is said unknown light beam.

15. The apparatus of claim 14, wherein said controller means includes feedback means for automatically resetting the same to maintain synchronization with said optical means by said second means after initial synchronization by said first means.

16. The apparatus of claim 15, further comprising display means for visually displaying in digital form the value of said electrical output signal as an indication of the relative intensity of each detected color light of said unknown light beam, electrical oscillator means for producing a clock signal, and wherein said output means comprises counter means for producing a digital output signal in response to said clock signal, said counter means producing and delivering to said controller means a control signal upon achieving a predetermined digital output signal for sequentially operating the latter, logic means for controllably coupling said digital output signals to said display means, and comparator means for detecting the occurrence of said predetermined signal level to control said logic means to deliver said digital output signals to said display means.

17. The apparatus of claim 1, wherein said integrator means has first and second inputs, one of said inputs being inverting with respect to the other, and further comprising switch means for delivering said unknown electrical signals from said common circuit means to said non-inverting input and said reference electrical signals to said inverting input.

18. The apparatus of claim 17, further comprising compensating means for modifying said electrical output signal to compensate for reflectance error in said optical means.

19. The apparatus of claim 18, wherein said compensating means includes storage means for storing a compensating electrical signal as a percentage of said reference electrical signal representative of such reflectance error, and delivery means for delivering said compensating electrical signal to said inverting input of said integrator means when said unknown electrical signal is delivered to said non-inverting input.

20. The apparatus of claim 19, further comprising a plurality of color filter means for filtering both said unknown and reference light beams, means for cyclically sequentially interposing each color filter means in said light beams, whereby for each color light detected by said photosensitive means respective pairs of unknown and reference electrical signals are produced and respective electrical output signals are produced, and wherein said compensating means comprises a corresponding plurality of the same, and further comprising multiplexing means responsive to the color filter interposed in said respective light beams for selectively opening respective storage means when respective reference light beams are detected and for selectively controlling delivery of respective compensating electrical signals to said integrator means when said unknown light beams are detected.

21. The apparatus of claim 1, further comprising compensating means for modifying said electrical output signal to compensate for reflectance error in said optical means.

22. The apparatus of claim 21, wherein said compensating means includes storage means for storing a compensating electrical signal as a percentge of said reference electrical signal representative of such reflectance error, and delivery means for delivering said compensating electrical signal to said integrator means for simultaneous integration in relatively opposite polarity direction with said unknown electrical signal.

23. The apparatus of claim 22, further comprising a plurality of color filter means for filtering both said unknown and reference light beams, means for cyclically sequentially interposing each color filter means in said light beams, whereby for each color light detected by said photosensitive means respective pairs of unknown and reference electrical signals are produced and respective electrical output signals are produced, and wherein said compensating means comprises a corresponding plurality of the same, and further comprising multiplexing means responsive to the color filter interposed in said respective light beams for selectively opening respective storage means when respective reference light beams are detected and for selectively controlling delivery of respective compensating electrical signals to said integrator means when said unknown light beams are detected.

24. A comparison type optical measuring apparatus, comprising:
photosensitive means for producing an electrical output representative of light received thereby,
optical means for sequentially directing unknown light beams of different respective colors to said photosensitive means thereby to cause said photosensitive means to produce for each color respective unknown electrical signals,
integrator means for sequentially integrating in one polarity direction each of said unknown electrical signals for a predetermined duration to produce respective integrated signal levels and then a reference electrical signal in the opposite polarity direction,
output means for producing electrical output signals indicative of the times required for said integrator means to integrate said reference electrical signal from each of such integrated signal levels to a predetemined signal level, whereby said electrical output signals are representative of respective comparisons of said unknown and reference electrical signals,
calibrating means for adjusting the magnitude of said electrical output signals, said calibrating means including amplifier means operatively coupled between said photosensitive means and said integrator means for amplifying the electrical output of the former prior to delivery to the latter, and means for changing the gain of said amplifier means for each color of said unknown light beam detected by said photosensitive means, said means for changing including a plurality of circuit channels, each including at least one selectively adjustable impedance means for establishing respective basic gains for said amplifier means, said calibrating means further including circuit channel means for establishing a predetermined gain for said amplifier means,
multiplexing means for operatively coupling respective circuit channels to said amplifier means when respective colors of said unknown light beam are detected by said photosensitive means, said multiplexing means further including further means for operatively coupling said circuit channel means to said amplifier means whenever said unknown light beam is not being detected by said photosensitive means; and
means for applying said reference electrical signal to said amplifier means 25. The apparatus of claim 24, wherein said optical means includes means for directing a reference light beam to said photosensitive means to produce said reference electrical signal.

26. A comparison type optical measuring apparatus, comprising:
photosensitive means for producing an electrical output representative of light received thereby,
optical means for sequentially directing unknown light beams of different respective colors to said photosensitive means thereby to cause said photosensitive means to produce for each color respective unknown electrical signals,
integrator means for sequentially integrating in one polarity direction each of said unknown electrical signals for a predetermined duration to produce respective integrated signal levels and then a reference electrical signal in the opposite polarity direction,
output means for producing electrical output signals, indicative of the times required for said integrator means to integrate said reference electrical signal from each of such integrated signal levels to a predetermined signal level, whereby said electrical output signals are representative of respective comparisons of said unknown and reference electrical signals,
calibrating means for adjusting the magnitude of said electrical output signals, said calibrating means including amplifier means operatively coupled between said photosensitive means and said integrator means for amplifying the electrical output of the former prior to delivery to the latter, and means for changing the gain of said amplifier means for each color of said unknown light beam detected by said photosensitive means, said means for changing including a plurality of circuit channels, each including at least one impedance means for establishing respective basic gains for said amplifier means,
multiplexing means for operatively coupling respective circuit channels to said amplifier means when respective colors of said unknown light beam are detected by said photosensitive means, said multiplexing means including counter-like controller means for controlling respective operative couplings of said circuit channels and said amplifier means,
means for applying said reference electrical signal to said amplifier means during at least part of the time that an unknown electrical signal is not being applied thereto,
means for indicating to said multiplexing means the color light being detected by said photosensitive means thereby to synchronize said multiplexing means and said optical means, display means for visually displaying in digital form the values of said electrical output signals as indications of the relative intensities of each detected color light of said unknown light beam, electrical oscillator means for producing a clock signal, and wherein said output means comprises counter means for producing a digital output signal in response to said clock signal, said counter means producing and delivering to said controller means a control signal upon achiving a predetermined digital output signal for sequentially operating the latter, logic means for controllably coupling said digital output signals to said display means, and comparator means for detecting the occurrence of said predetermined signal level to control said logic means to deliver said digital output signals to said display means.

27. The apparatus of claim 26, wherein said means for indicating includes first means for indicating to said controller means the initiation of a cycle of sequential interposing of respective color filters in said unknown light beam and second means for indicating to said controller means that a color filter has become interposed in said unknown light beam.

28. The apparatus of claim 27, wherein said controller means includes feedback means for automatically resetting the same to maintain synchronization with said optical means by said second means after initial synchronization by said first means.

29. The apparatus of claim 27, wherein said optical means includes means for directing a reference light beam to said photosensitive means to produce said reference electrical signal.

30. A comparison type measuring apparatus, comprising:

transducer means for producing an electrical output representative of an input thereto, means for cyclically directing an unknown input to said transducer means thereby to cause the latter to produce unknown electrical signals, integrator means for integrating in one polarity direction one of said unknown electrical signals for a predetermined duration to produce an integrated signal level and then a reference electrical signal in the opposite polarity direction, said integrator means having first and second inputs, one of said inputs being inverting with respect to the other, and further comprising switch means for sequentially delivering one of said unknown and reference electrical signals to said non-inverting input and the other said unknown and reference electrical signals to said inverting input, and output means for producing an electrical output signal indicative of the time required for said integrator means to integrate said reference electrical signal from such integrated signal level to a predetermined signal level, whereby said electrical output signal is representative of a comparison of said unknown and reference electrical signals.

31. The apparatus of claim 30, further comprising means for operating said switch means to deliver said unknown electrical signal to said non-inverting input and said reference electrical signal to said inverting input.

32. The apparatus of claim 30, wherein said transducer means comprises a photosensor and said means for cyclically directing comprises optical means for directing an unknown light beam to said photosensor.

33. The apparatus of claim 32, further comprising compensating means for modifying said electrical output signal to compensate for reflectance error in said optical means.

34. The apparatus of claim 33, wherein said optical means includes means for directing a reference light beam to said photosensor to produce said reference electrical signal.

35. The apparatus of claim 34, wherein said compensating means includes storage means for storing a compensating electrical signal as a percentage of said reference electrical signal representative of such reflectance error, and delivery means for delivering said compensating electrical signal to said inverting input of said integrator means when said unknown electrical signal is delivered to said non-inverting input.

36. A comparison type optical measuring apparatus, comprising:

transducer means for producing an electrical output representative of an input thereto, means for directing an unknown input to said transducer means thereby to cause the latter to produce unknown electrical signals, integrator means for integrating in one polarity direction one of said integrated signal level and then the other of said unknown and reference electrical signals in the opposite polarity direction, output means for producing an electrical output signal indicative of the time required for said integrator means to integrate said reference electrical signal from such integrated signal level to a predetermined signal level, whereby said electrical output signal is representative of a comparison of said unknown and reference electrical signals, and compensating means for modifying said electrical output signal to compensate for error in said means for directing, said compensating means including storage means for storing a compensating electrical signal as a percentage of said reference electrical signal representative of such error, and delivery means for delivering said compensating electrical signal to an inverting input of said integrator means when said unknown electrical signal is delivered to a non-inverting input thereof.

37. The apparatus of claim 36, wherein said transducer means comprises a photosensor and said means for directing comprises optical means for directing an unknown light beam to said photosensor to produce said unknown electrical signal.

38. The apparatus of claim 37, wherein said means for directing includes means for directing a reference light beam to said photosensor to produce said reference electrical signal.

* * * * *